(12) United States Patent
Kaku et al.

(10) Patent No.: US 8,130,562 B2
(45) Date of Patent: Mar. 6, 2012

(54) SEMICONDUCTOR MEMORY DEVICE HAVING SHIFT REGISTERS

(75) Inventors: Daichi Kaku, Kanagawa-ken (JP); Toshimasa Namekawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 193 days.

(21) Appl. No.: 12/692,111

(22) Filed: Jan. 22, 2010

(65) Prior Publication Data
US 2010/0195410 A1   Aug. 5, 2010

(30) Foreign Application Priority Data
Feb. 5, 2009   (JP) .................................. 2009-025389

(51) Int. Cl.
*G11C 7/10* (2006.01)
(52) U.S. Cl. .................. 365/189.05; 365/189.12; 365/63
(58) Field of Classification Search ............. 365/189.05, 365/189.12, 63
See application file for complete search history.

(56) References Cited

U.S. PATENT DOCUMENTS

| | | | | |
|---|---|---|---|---|
| 5,369,618 A | * | 11/1994 | Takasugi | 365/230.01 |
| 6,216,205 B1 | * | 4/2001 | Chin et al. | 365/230.05 |
| 6,542,411 B2 | * | 4/2003 | Tanikawa et al. | 365/185.33 |
| 2002/0048193 A1 | * | 4/2002 | Tanikawa et al. | 365/185.33 |
| 2008/0094898 A1 | | 4/2008 | Nakano et al. | |

* cited by examiner

*Primary Examiner* — Tuan T. Nguyen
(74) *Attorney, Agent, or Firm* — Oblon, Spivak, McClelland, Maier & Neustadt, L.L.P.

(57) ABSTRACT

A semiconductor memory device includes n stages of memory cell units, sense amplifier units, and shift registers. N units of the shift registers are connected to one another on the left end sides. The signal processing units and the reversed signal processing units are disposed adjacent to one another in each of the n units of the shift registers. The signal processing units located on the odd-numbered positions counted from the input end side are connected to one another. The reversed signal processing units located on the even-numbered positions counted from the input end side are connected to one another. The signal processing units located on the end opposite to the input end side are connected to the reversed signal processing units located on the end opposite to the input end side. Each of the signal processing units includes the logic circuit unit and the flip-flop while each of the reversed signal processing units includes the reversed logic circuit unit and the reversed flip-flop.

15 Claims, 9 Drawing Sheets

SEMICONDUCTOR MEMORY DEVICE HAVING SHIFT REGISTERS

CROSS REFERENCE TO RELATED APPLICATION

This application is based upon and claims the benefit of priority from the prior Japanese Patent Application No. P2009-25389, filed on Feb. 5, 2009, the entire contents of which are incorporated herein by reference.

FIELD OF THE INVENTION

The invention relates to a semiconductor memory device having shift registers.

DESCRIPTION OF THE BACKGROUND

Shift registers are indispensable circuits for a semiconductor memory device having serial input/output. The semiconductor memory device senses data at the time of readout, and outputs data serially by storing the data in the shift registers. Moreover, the semiconductor memory device performs writing serially by storing write data in the shift registers at the time of writing. Japanese Patent Application Publication No. 2004-64557 discloses such shift registers.

The shift registers are separated from each other. The shift registers shift data in the same direction. Each of the shift registers is connected to the adjacent one of the shift registers. A line to connect the separate shift registers is longer than a line to connect flip-flops provided inside each of the shift registers. Accordingly, the shift registers have large resistance or large parasitic capacitance so that the shift registers operate with low maximum operation frequency. As a result, the shift registers have a problem of being incapable of performing high-speed serial input/output access.

SUMMARY OF THE INVENTION

According to an aspect of the invention is provided a semiconductor memory device, comprising a shift register including first latch circuits and second latch circuits being disposed alternately, repeatedly and adjacently to one another, the shift register receiving an input signal and outputting an output signal, wherein each of the second latch circuits is disposed to have a configuration reversed from configurations of the first latch circuits, the input signal is inputted to one of the first latch circuits arranged on an input end side, an output side of the one of the first latch circuits provided on the input end side is electrically connected to an input side of one of the first latch circuits which is disposed through one of the second latch circuits and which is provided on an end side opposite to the input end side, an output side of the one of the first latch circuits provided on the end side is electrically connected to an input side of one of the second latch circuits provided on the end side, an output side of the one of the second latch circuits provided on the end side is electrically connected to an input side of one of the second latch circuits which is disposed through one of the first latch circuits provided on the input end side, and the output signal is serially accessed and is outputted to the input end side from the one of the second latch circuits provided on the input end side.

According to another aspect of the invention is provided a semiconductor memory device, comprising a shift register including a plurality of first signal processing units and a plurality of second signal processing units, the first signal processing units each having a first latch circuit and a first logic circuit unit, the second signal processing units each having a second latch circuit disposed to have a configuration reversed from a configuration of the first latch circuit and a second logic circuit unit disposed to have a configuration reversed from a configuration of the first logic circuit unit, the first signal processing units and the second signal processing units being alternately, repeatedly and adjacently to one another, the shift register receiving an input signal and outputting an output signal, wherein memory information read out is inputted to each of the first and second logic circuit units, a signal outputted from the first logic circuit unit is inputted to the first latch circuit, a signal outputted from the second logic circuit unit is inputted to the second latch circuit, the input signal is inputted to the first latch circuit arranged on an input end side via the first logic circuit unit arranged on the input end side, an output side of the one of the first signal processing units provided on the input end side is electrically connected to an input side of one of the first signal processing units which is disposed through one of the second signal processing units and which is provided on an end side opposite to the input end side, an output side of the one of the first signal processing units provided on the end side is electrically connected to an input side of one of the second signal processing units provided on the end side, an output side of the one of the second signal processing units provided on the end side is electrically connected to an input side of one of the second signal processing units which is disposed through one of the first signal processing units and which is provided on the input end side, and the output signal is serially accessed and is outputted to the input end side from the one of the second latch circuits provided on the input end side.

According to another aspect of the invention is provided a semiconductor memory device, comprising a first shift register including a plurality of first signal processing units and a plurality of second signal processing units, the first signal processing units each having a first latch circuit and a first logic circuit unit, the second signal processing units each having a second latch circuit disposed to have a configuration reversed from a configuration of the first latch circuit and a second logic circuit unit disposed to have a configuration reversed from a configuration of the first logic circuit unit, the first signal processing units and the second signal processing units being alternately, repeatedly and adjacently to one another, the first shift register receiving a first input signal and outputting a first output signal; and a second shift register having the same circuit configuration as the circuit configuration of the first shift register, being disposed in parallel to and in the same direction as the first shift register, and receiving a second input signal and outputting a second output signal, wherein memory information read out is inputted to each of the first and second logic circuit units, a signal outputted from the first logic circuit unit is inputted to the first latch circuit, a signal outputted from the second logic circuit unit is inputted to the second latch circuit, the first and second input signals are inputted from the same direction, the first input signal is inputted to the first latch circuit provided on an input end side in the first shift register via the first logic circuit unit provided on the input end side in the first shift register, the second input signal is inputted to the first latch circuit provided on an input end side in the second shift register via the first logic circuit unit provided on the input end side in the second shift register, an output side of the one of the first signal processing units provided on the input end side in the first shift register is electrically connected to an input side of one of the first signal processing units in the first shift register which is disposed through one of the second signal processing units and which is provided on an end side opposite to the input end side, an output side of the one of the first signal processing units provided on the input end side in the second shift register is electrically connected to an input side of one of the first signal processing units of the second shift register which is disposed through one of the second signal processing units and which is provided on the end side, an output side of the one of the first signal processing units provided on the end side in the first shift register is electrically connected to an input side of one of the second signal processing units provided on the end side in the first shift register, an output side of the one of the first signal processing units provided on the end side in the second shift register is electrically connected to an input side of one of the second signal processing units of the second shift register provided on the end side in the second shift register, an output side of the one of the second signal processing units provided on the end side in the first shift register is electrically connected to an input side of one of the second signal processing units in the first shift register which is disposed through one of the first signal processing units which is provided on the input end side, an output side of the one of the second signal processing units provided on the end side in the second shift register is electrically connected to an input side of one of the second signal processing units in the second shift register which is disposed through one of the first signal processing units which is provided on the input end side, the first output signal is serially accessed and is outputted to the input end side from the one of the second latch circuits provided on the input end side of the first shift register, the second shift register receives the first output signal as the second input signal, and the second output signal is serially accessed and is outputted to the input end side from the one of the second latch circuits provided on the input end side in the second shift register.

DETAILED DESCRIPTION OF THE INVENTION

Embodiments of the present invention will be described below in detail with reference to the drawings.

Figure 1:
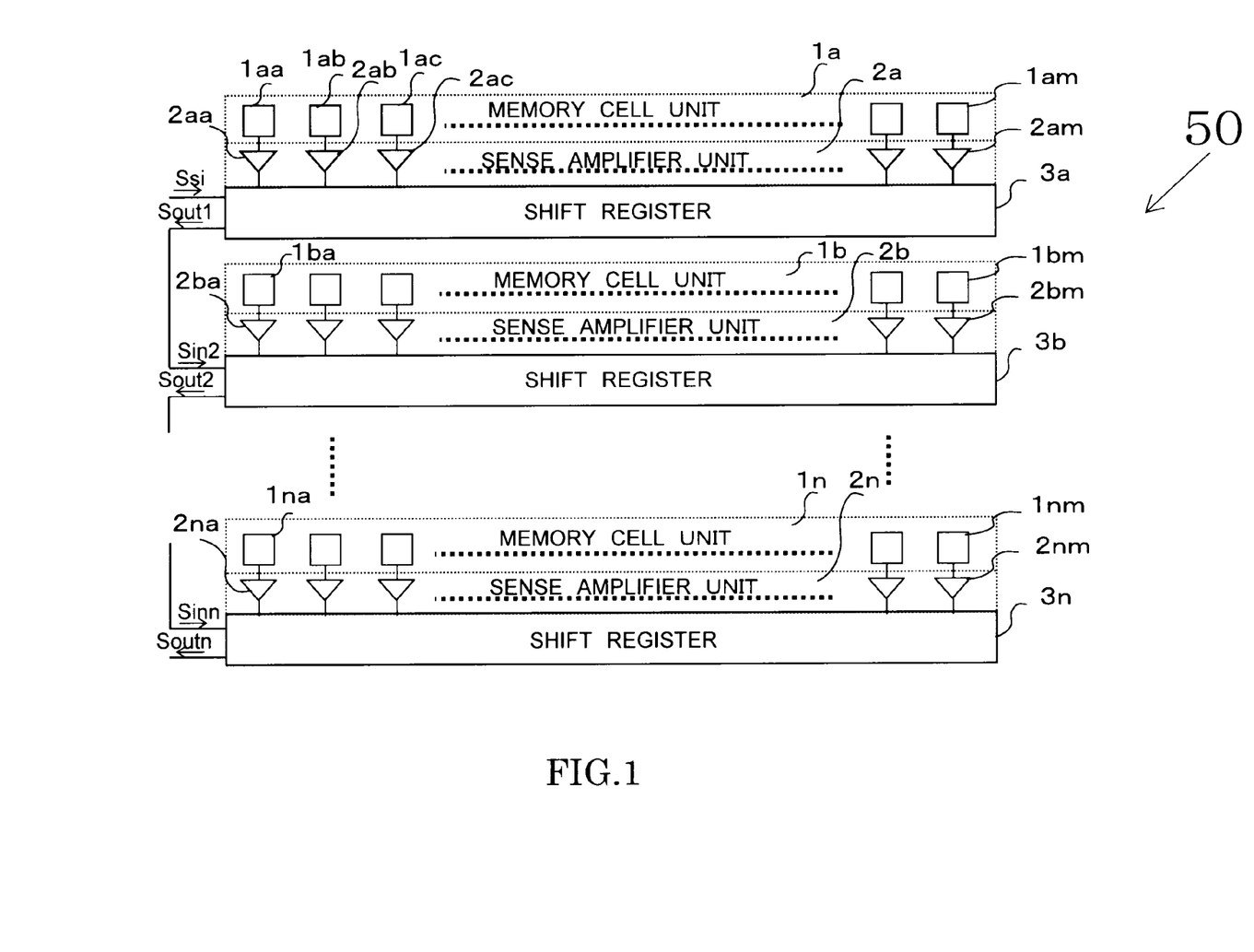
FIG. 1 is a block diagram showing a semiconductor memory device according to a first embodiment of the invention.
Figure 2:
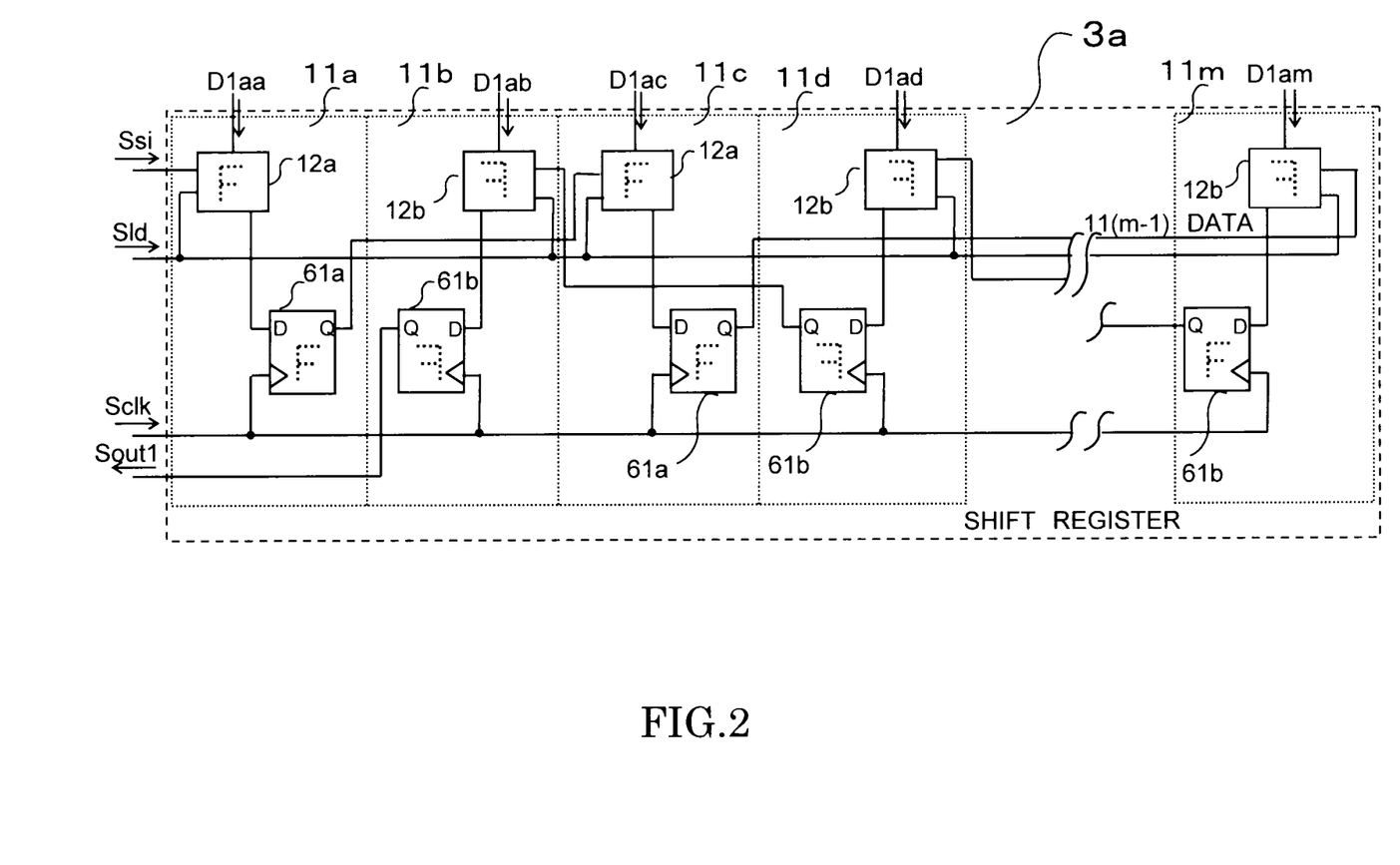
FIG. 2 is a block diagram showing a configuration of a shift register according to the first embodiment of the invention.
Figure 3:
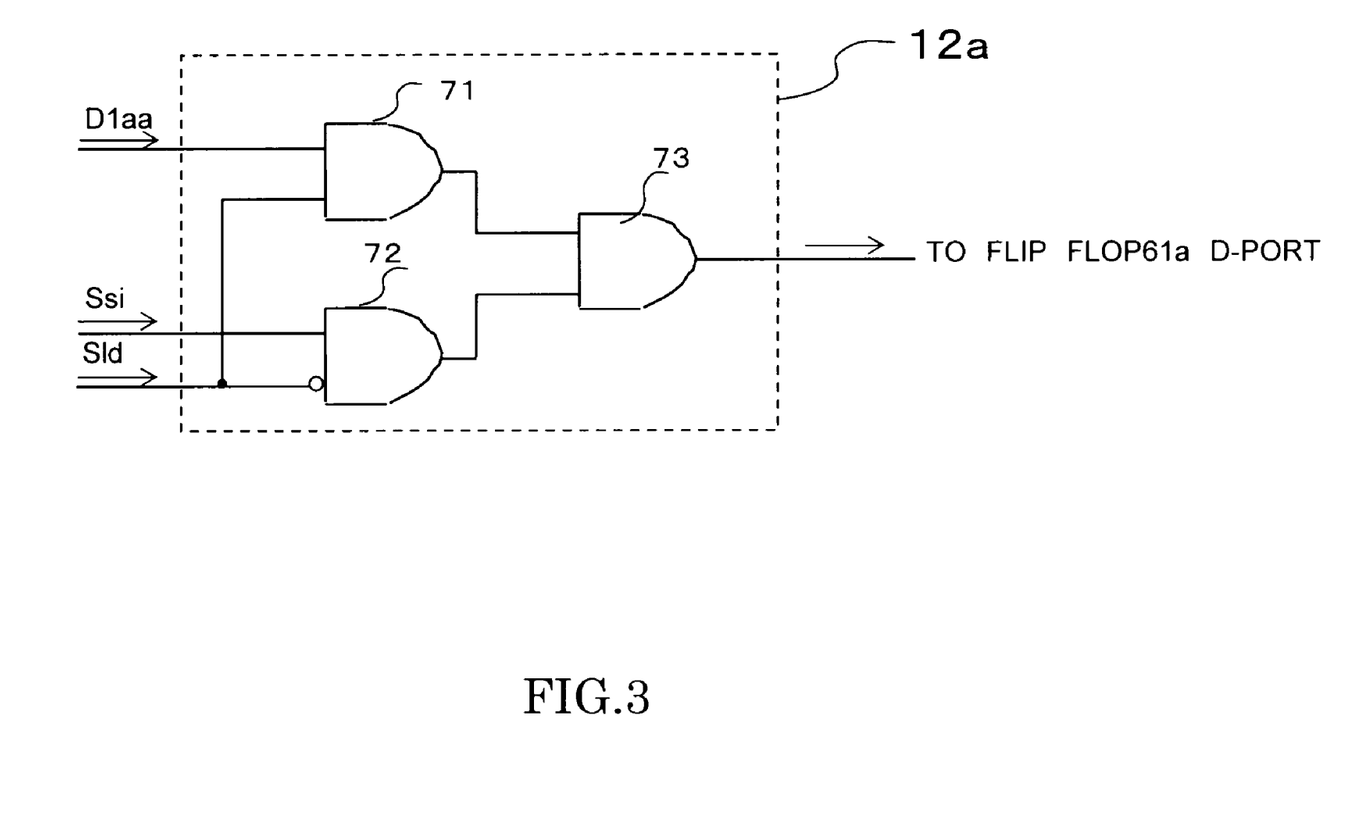
FIG. 3 is a block diagram showing a configuration of a logic circuit unit according to the first embodiment of the invention.

A semiconductor memory device according to a first embodiment of the invention will be described with reference to FIGS. 1 to 3. FIG. 1 is a block diagram showing a semiconductor memory device. FIG. 2 is a block diagram showing a configuration of a shift register. FIG. 3 is a block diagram showing a logic circuit unit. In the shift register of the first embodiment, each pair of even-numbered and odd-numbered signal processing units are arranged to have configurations reversed from each other in a lateral direction in the drawing.

As shown in FIG. 1, a semiconductor memory device 50 includes n stages of memory cell units, sense amplifier units, and shift registers, which are arranged vertically in the drawing. Here, a group of memory cell units from a memory cell unit 1b on a second stage to a memory cell unit 1n on an n-th stage have the same circuit configuration as a memory cell unit 1a on a first stage and are disposed in parallel in the same direction (normally disposed). A group of sense amplifier units from a sense amplifier unit 2b on the second stage to a sense amplifier unit 2n on the n-th stage have the same circuit configuration as a sense amplifier unit 2a on the first stage and are disposed in parallel in the same direction (normally disposed). A group of shift registers from a shift register 3b on the second stage to a shift register 3n on the n-th stage have the same circuit configuration as a shift register 3a on the first stage and are disposed in parallel in the same direction (normally disposed).

The memory cell unit 1a on the first stage includes m memory cells (a memory cell 1aa, a memory cell 1ab, a memory cell 1ac, . . . , a memory cell 1am) arranged in a lateral direction in the drawing. Each of the memory cells stores information. The sense amplifier unit 2a on the first stage contacts the memory cell unit 1a on the first stage. The sense amplifier unit 2a on the first stage includes m sense amplifiers (a sense amplifier 2aa, a sense amplifier 2ab, a sense amplifier 2ac, . . . , a sense amplifier 2am) arranged in the lateral direction in the drawing. Each of the sense amplifiers is connected to the corresponding memory cell and is configured to amplify and output the information in the memory cell. The shift register 3a on the first stage contacts the sense amplifier unit 2a. A serial input signal Ssi is inputted from the left side in the drawing to the shift register 3a on the first stage. The shift register 3a on the first stage serially accesses the information read out of the memory cells. The shift register 3a on the first stage outputs an output signal Sout1, which is a serial output signal, from the side to which the serial input signal Ssi is inputted (the left side in the drawing).

The memory cell unit 1b on the second stage includes m memory cells (a memory cell 1ba, . . . , a memory cell 1bm) arranged in the lateral direction in the drawing. Each of the memory cells stores information. The sense amplifier unit 2b on the second stage contacts the memory cell unit 1b on the second stage. The sense amplifier unit 2b on the second stage includes m sense amplifiers (a sense amplifier 2ba, . . . , a sense amplifier 2bm) arranged in the lateral direction in the drawing. Each of the sense amplifiers is connected to the corresponding memory cell and is configured to amplify and output the information in the memory cell. The shift register 3b on the second stage contacts the sense amplifier unit 2b. The serial output signal Sout1 which is outputted from the shift register 3a on the first stage is inputted as an input signal Sin2 from the left side in the drawing to the shift register 3b on the second stage. The shift register 3b on the second stage serially accesses the information read out of the memory cells. The shift register 3b on the second stage outputs an output signal Sout2, which is a serial output signal, from the side to which the input signal Sin2 is inputted (the left side in the drawing).

The memory cell unit 1n on the n-th stage includes m memory cells (a memory cell 1na, ..., a memory cell 1nm) arranged in the lateral direction in the drawing. Each of the memory cells stores information. The sense amplifier unit 2n on the n-th stage contacts the memory cell unit 1n on the n-th stage. The sense amplifier unit 2n on the n-th stage includes m sense amplifiers (a sense amplifier 2na, ..., a sense amplifier 2nm) arranged in the lateral direction in the drawing. Each of the sense amplifiers is connected to the corresponding memory cell and is configured to amplify and output the information in the memory cell. The shift register 3n on the n-th stage contacts the sense amplifier unit 2n. The serial output signal Sout(n−1) which is outputted from an unillustrated shift register on an (n−1)-th stage is inputted as an input signal Sinn from the left side in the drawing to the shift register 3n on the n-th stage. The shift register 3n on the n-th stage serially accesses the information read out of the memory cells. The shift register 3n on the n-th stage outputs an output signal Soutn, which is a serial output signal, from the side to which the input signal Sinn is inputted (the left side in the drawing).

As shown in FIG. 2, the shift register 3a on the first stage includes m signal processing units which are respectively connected to the sense amplifiers, in which (m/2) units are signal processing units (11a, 11c, and so forth) and the remaining (m/2) units are reversed signal processing units (11b, 11d, ..., 11m).

Here, the signal processing units (11a, 11c, and so on) and the reversed signal processing units (11b, 11d, ..., 11m) have the same circuit configuration. The reversed signal processing units (11b, 11d, ..., 11m) are disposed in a laterally reversed manner relative to the signal processing units (11a, 11c, and so forth). A clock signal Sclk and a load signal Sld are inputted to the shift register 3a on the first stage from the side to which the serial signal Ssi is inputted (the left side in the drawing).

The signal processing unit 11a, the signal processing unit 11c, and so forth are disposed on odd-numbered positions counted from the side to which the serial signal Ssi is inputted. Each of the first signal processing unit 11a, the third signal processing unit 11c, and so forth includes a logic circuit unit 12a and a flip-flop 61a. The signal processing unit 11a, the signal processing unit 11c, and so forth are electrically connected to one another. In other words, an output side of a signal processing unit provided on the input end side is electrically connected to an input side of a signal processing unit, which is disposed to be adjacent through an reversed signal processing unit, provided on end side opposite to the input end side. The flip-flop 61a is a latch circuit which latches data at rising edge of the clock signal.

The first signal processing unit 11a is connected to the third signal processing unit 11c. The serial input signal Ssi, the load signal Sld, and memory cell data D1aa in the memory cell 1aa amplified by the sense amplifier 2aa are inputted to the logic circuit unit 12a of the first signal processing unit 11a. The first signal processing unit 11a executes logic operation processing and outputs a logic operation result to a D port of the flip-flop 61a of the first signal processing unit 11a. The flip-flop 61a of the first signal processing unit 11a latches the data inputted to the D port at a rising edge of the clock signal Sclk and outputs the latched data from a Q port.

The third signal processing unit 11c is connected to the unillustrated fifth signal processing unit 11e. The signal outputted from the flip-flop 61a of the first signal processing unit 11a, the load signal Sld, and memory cell data D1ac in the memory cell 1ac amplified by the sense amplifier 2ac are inputted to the logic circuit unit 12a of the third signal processing unit 11c. The third signal processing unit 11c executes the logic operation processing and outputs a logic operation result to the D port of the flip-flop 61a of the third signal processing unit 11c. The flip-flop 61a of the third signal processing unit 11c latches the data inputted to the D port at the rising edge of the clock signal Sclk and outputs the latched data from the Q port. Note that the fifth signal processing unit 11e to the (m−1)-th signal processing unit 11(m−1) have similar configurations and operations and relevant illustration and explanation will be omitted.

The reversed signal processing unit 11b, the reversed signal processing unit 11d, ..., the reversed signal processing unit 11m are disposed on even-numbered positions counted from the side to which the serial signal Ssi is inputted. Each of the second signal processing unit 11b, the fourth signal processing unit 11d, ..., the m-th reversed signal processing unit 11m includes an reversed logic circuit unit 12b and an reversed flip-flop 61b. The reversed signal processing unit 11b, the reversed signal processing unit 11d, ..., and the m-th reversed signal processing unit 11m are electrically connected to one another. In other words, an output side of an reversed signal processing unit provided on the end side is electrically connected to an input side of an reversed signal processing unit, which is disposed to be adjacent through a signal processing unit, provided on the input end side.

Here, the reversed logic circuit unit 12b is disposed in a laterally reversed manner relative to the logic circuit unit 12a. The reversed flip-flop 61b is disposed in a laterally reversed manner relative to the flip-flop 61a. The reversed flip-flop 61b is a latch circuit which latches data at rising edge of the clock signal.

The m-th reversed signal processing unit 11m is connected to the unillustrated (m−1)-th signal processing unit 11(m−1) located on an odd-numbered position. The signal outputted from the flip-flop 61a of the (m−1)-th signal processing unit 11(m−1), the load signal Sld, and memory cell data D1am in the memory cell 1am amplified by the sense amplifier 2am are inputted to the reversed logic circuit unit 12b of the m-th reversed signal processing unit 11m. The reversed logic circuit unit 12b of the m-th reversed signal processing unit 11m executes the logic operation processing and outputs a logic operation result to the D port of the reversed flip-flop 61b of the m-th reversed signal processing unit 11m. The reversed flip-flop 61b of the m-th reversed signal processing unit 11m latches the data inputted to the D port at the rising edge of the clock signal Sclk and outputs the latched data from the Q port as an output signal. This output signal is inputted to the reversed logic circuit unit 12b of the (m−2)-th reversed signal processing unit 11(m−2). Note that the (m−2)-th signal processing unit 11(m−2) to the sixth signal processing unit 11f have similar configurations and operations and relevant illustration and explanation will be omitted.

The fourth reversed signal processing unit 11d is connected to the unillustrated sixth signal processing unit 11f. The signal outputted from the reversed flip-flop 61b of the sixth reversed signal processing unit 11f, the load signal Sld, and memory cell data D1af in the memory cell 1af amplified by the sense amplifier 2af are inputted to the reversed logic circuit unit 12b of the fourth reversed signal processing unit 11d. The reversed logic circuit unit 12b of the fourth reversed signal processing unit 11d executes the logic operation processing and outputs a logic operation result to the D port of the reversed flip-flop 61b of the fourth reversed signal processing unit 11d. The reversed flip-flop 61b of the fourth reversed signal processing unit 11d latches the data inputted to the D port at the rising edge of the clock signal Sclk and outputs the latched data from the Q port as an output signal.

The signal outputted from the reversed flip-flop 61b of the fourth reversed signal processing unit 11d, the load signal Sld, and memory cell data D1ab in the memory cell 1ab amplified by the sense amplifier 2ab are inputted to the reversed logic circuit unit 12b of the second reversed signal processing unit 11b. The reversed logic circuit unit 12b of the second reversed signal processing unit 11b executes the logic operation processing and outputs a logic operation result to the D port of the reversed flip-flop 61b of the second reversed signal processing unit 11b. The reversed flip-flop 61b of the second reversed signal processing unit 11b latches the data inputted to the D port at the rising edge of the clock signal Sclk and outputs the latched data from the Q port as the output signal Sout1 of the shift register 3a to the side to which the serial signal Ssi is inputted.

That is to say, in each of the (m/2) signal processing units (11a, 11c, and so forth) and the (m/2) reversed signal processing units (11b, 11d, . . . , 11m) provided in the shift register 3a on the first stage, the flip-flop retrieves the information inputted from outside to the Q port when the load signal Sld is at a high level and outputs the information in the immediately preceding flip-flop when the load signal Sld is at a low level. Here, the shift register 3a on the first stage is illustrated and described. However, similar operations take place throughout the shift registers ranging from the shift register 3b on the second stage to the shift register 3n on the n-th stage having the same configuration as the shift register 3a on the first stage (however, the input signal is changed).

Although a D type flip-flop is used for the flip-flop 61a and the reversed flip-flop 61b, a J-K type flip-flop may be used instead, for example. Moreover, setting and resetting functions may be provided to any of the flip-flops as appropriate.

The logic circuit unit 12a is provided with a two-input AND circuit 71, a two-input AND circuit 72, and a two-input AND circuit 73. The reversed logic circuit 12b that represents the reversed pattern of the logic circuit unit 12a is also provided with the two-input AND circuit 71, the two-input AND circuit 72, and the two-input AND circuit 73. FIG. 3 shows the logic circuit 12a of the first signal processing unit 11a as a configuration example.

As shown in FIG. 3, the memory cell data D1aa and the load signal Sld are inputted to the two-input AND circuit 71 to execute the logic operation processing. The serial input signal Ssi and an reversed signal of the load signal Sld are inputted to the two-input AND circuit 72 to execute the logic operation processing. The two-input AND circuit 73 receives inputs of a signal outputted from the two-input AND circuit 71 and a signal outputted from the two-input AND circuit 72 and executes the logic operation processing on the signals. The signal resulting from the logic operation by the two-input AND circuit 73 is outputted to the D port of the flip-flop.

Here, the difference between the logic circuit unit 12a of the first signal processing unit 11a and the other logic circuit units 12a as well as the logic circuit units 12b is only that the other logic circuit units 12a and 12b each receive different memory cell data and the signal, outputted from the flip-flop located in the preceding stage, instead of the serial input signal Ssi. Accordingly, the illustration and description of the other logic circuit units will be omitted.

Figure 4:
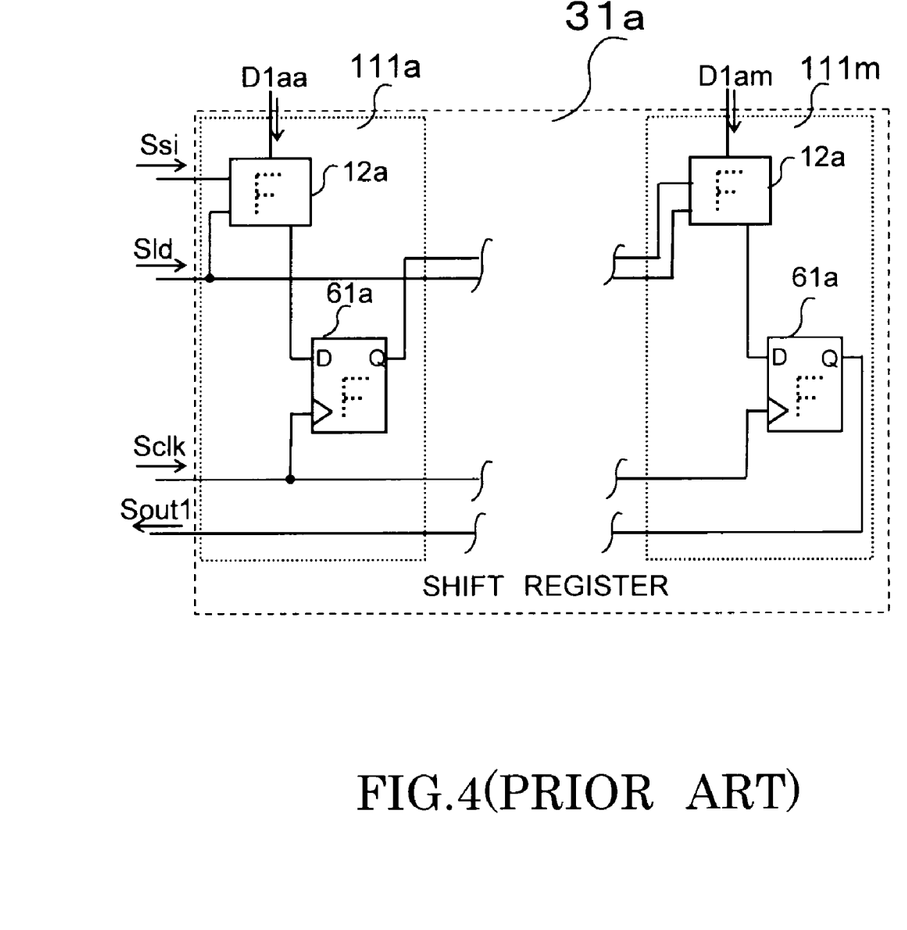
FIG. 4 is a block diagram showing a configuration of a shift register of a comparative example of the first embodiment of the invention.

Next, a shift register used in a semiconductor memory device of a comparative example will be described with reference to FIG. 4. FIG. 4 is a block diagram showing a configuration of the shift register of the comparative example.

As shown in FIG. 4, a shift register 31a of the comparative example includes m signal processing units (111a, . . . , 111m) which are disposed adjacent to one another. Each of the m signal processing units (111a, . . . , 111m) includes the flip-flop 61a and the logic circuit unit 12a. Note that the semiconductor memory device of the comparative example includes a sense amplifier unit and the memory cell unit having similar configurations as the semiconductor memory device 50 of the embodiment.

The first signal processing unit 111a counted from the side to which the serial signal Ssi is inputted is connected to the unillustrated second signal processing unit 111b. The serial input signal Ssi, the load signal Sld, and the memory cell data D1aa in the memory cell 1aa amplified by the sense amplifier 2aa are inputted to the logic circuit unit 12a of the first signal processing unit 111a. The logic circuit unit 12a of the first signal processing unit 111a executes the logic operation processing and outputs a logic operation result to the D port of the flip-flop 61a of the first signal processing unit 111a. The flip-flop 61a of the first signal processing unit 111a latches the data inputted to the D port at the rising edge of the clock signal Sclk and outputs the latched data from the Q port. Note that the second signal processing unit 111b to the (m−1)-th signal processing unit 111(m−1) have similar configurations and operations and relevant illustration and explanation will be omitted.

The m-th signal processing unit 111m is connected to the unillustrated (m−1)-th signal processing unit 111(m−1). The signal outputted from the flip-flop 61a of the (m−1)-th signal processing unit 111(m−1), the load signal Sld, and the memory cell data D1am in the memory cell 1am amplified by the sense amplifier 2am are inputted to the logic circuit unit 12a of the m-th signal processing unit 111m. The logic circuit unit 12a of the m-th signal processing unit 111m executes the logic operation processing and outputs a logic operation result to the D port of the flip-flop 61a of the m-th signal processing unit 111m. The flip-flop 61a of the m-th signal processing unit 111m latches the data inputted to the D port at the rising edge of the clock signal Sclk and outputs the latched data from the Q port as the output signal Sout1 of the shift register 31a to the side to which the serial signal Ssi is inputted.

A transmission path length to transmit the output signal Sout1 of the shift register 31a of the comparative example is substantially the same as the dimension of the shift register 31 in the lateral direction in the drawing, the dimension being longer than that of the semiconductor memory device 50 of the embodiment. Accordingly, an influence of a signal delay is more significant than the semiconductor memory device 50 of the embodiment.

As described above, according to the semiconductor memory device of the embodiment, the memory cell units, the sense amplifier units, and the shift registers are formed so as to be disposed in n stages. The n units of the shift register 3a, the shift register 3b, . . . , and the shift register 3n are connected to one another on the left end sides. The serial input signal Ssi is inputted to the shift register 3a on the first stage. The shift register 3a on the first stage outputs the output signal Sout1, which is the serial output signal, from the serial input end side. The output signal Sout1 is inputted as the serial input signal to the shift register 3b on the second stage. The shift register 3b on the second stage outputs the output signal Sout2, which is the serial output signal, from the serial input end side. The output signal Sout (n−1) is inputted as the serial input signal to the shift register 3n on the n-th stage. The shift register 3n on the n-th stage outputs the output signal Soutn, which is the serial output signal, from the serial input end side. The signal processing units and the reversed signal processing units are disposed adjacent to one another in each of the n units of the shift register 3a, the shift register 3b, . . . , and the shift register 3n. The signal processing units located on the odd-numbered positions counted from the input end side are connected to one another. The reversed signal processing units located on the even-numbered positions counted from the input end side are connected to one another. Moreover, the signal processing units located on the end opposite to the input end side are connected to the reversed signal processing units located on the end opposite to the input end side. Each of the signal processing units includes the logic circuit unit 12a and the flip-flop 61a while each of the reversed signal processing units includes the reversed logic circuit unit 12b and the reversed flip-flop 61b.

Accordingly, it is possible to drastically suppress an influence of a wiring delay and the semiconductor memory device 50 can perform high-speed serial input/output access. Moreover, the signal processing units each including the logic circuit unit 12a and the flip-flop 61a and the reversed signal processing units each including the reversed logic circuit unit 12b and the reversed flip-flop 61b are disposed alternately and adjacent to one another. Therefore, it is possible to share element forming regions of transistors (source or drain regions) in terms of a pattern layout and to achieve higher integration of the semiconductor memory device 50.

Although the flip-flop is used for each of the signal processing units and the reversed signal processing units in the embodiment, a latch circuit configured to latch the data at a falling edge of the clock signal may be used instead of the flip-flop. Meanwhile, although each of the logic circuit units 12a and the reversed logic circuit units 12b includes the two-input AND circuits 71 to 73, the invention is not limited only to this configuration and the logic may be formed by using other logic circuits.

Figure 5:
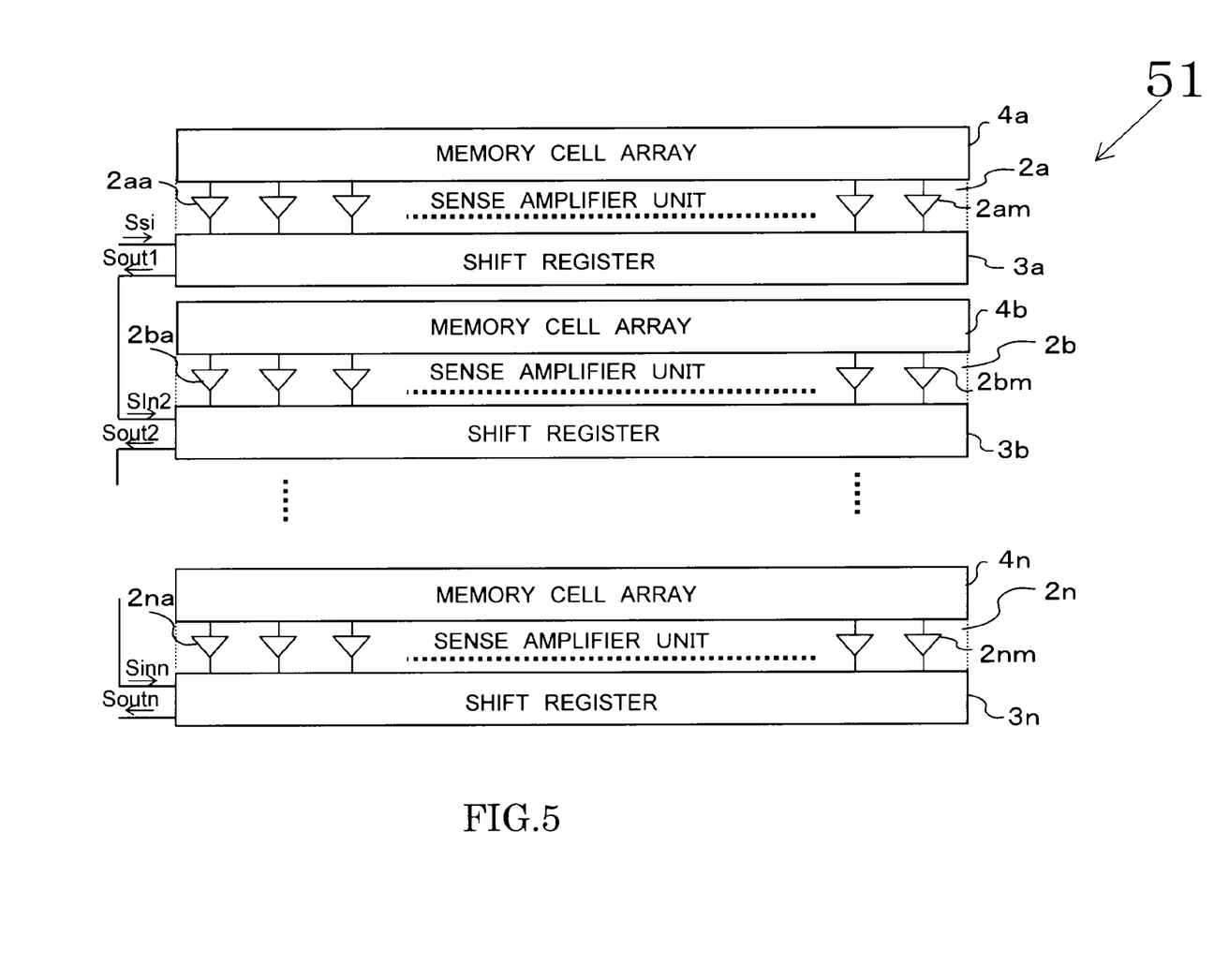
FIG. 5 is a block diagram showing a semiconductor memory device according to a second embodiment of the invention.
Figure 6:
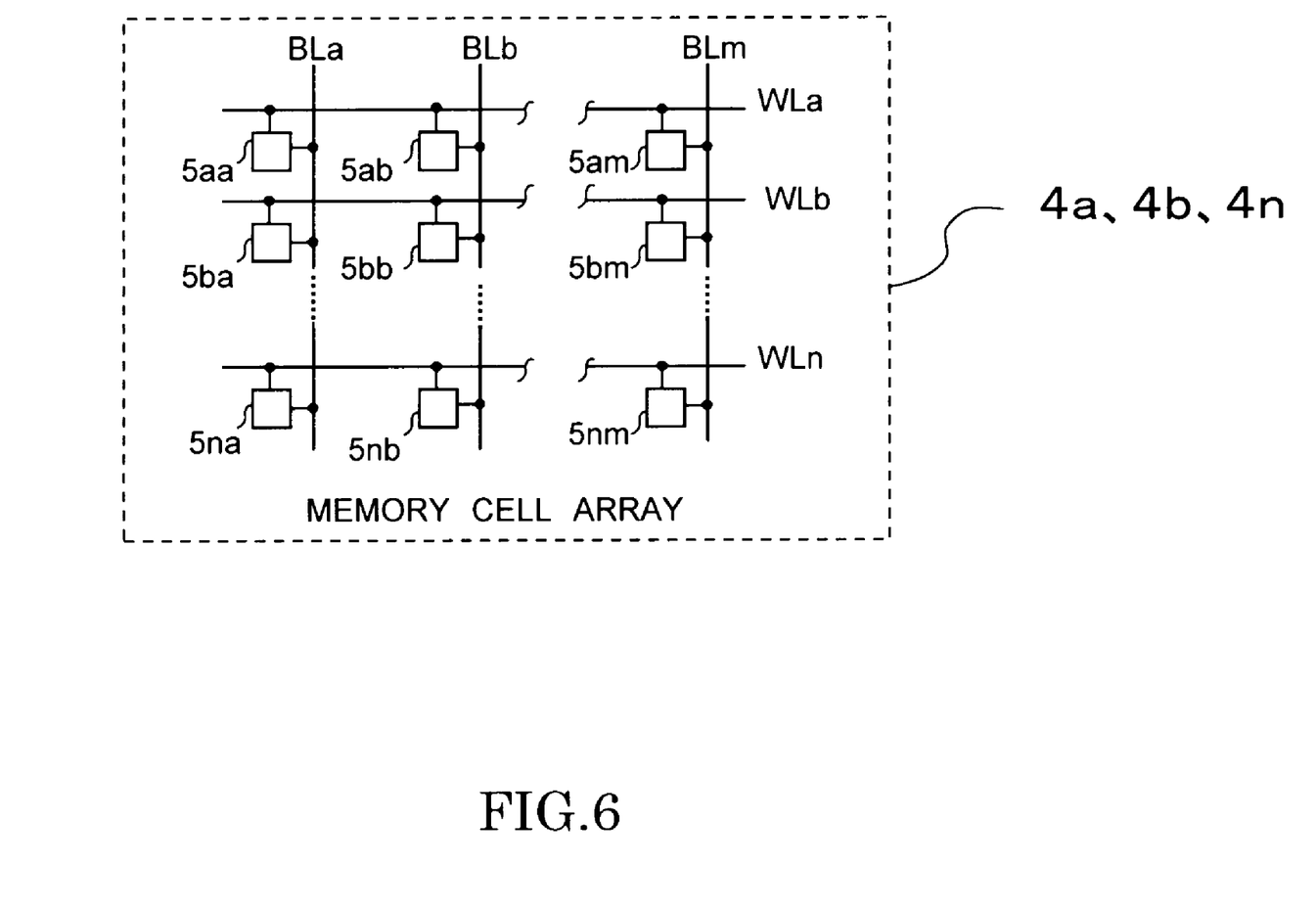
FIG. 6 is a block diagram showing a configuration of a memory cell array according to the second embodiment of the invention.

A semiconductor memory device according to a second embodiment of the invention will be described with reference to FIGS. 5 and 6. FIG. 5 is a block diagram showing a semiconductor memory device. FIG. 6 is a block diagram showing a configuration of a memory cell array. In the embodiment, a memory cell array including memory cells arranged in a matrix is provided.

In the following, identical portions to those in the first embodiment will be designated by identical reference numerals and only different portions will be described while omitting explanation on the identical portions.

As shown in FIG. 5, a semiconductor memory device 51 includes n stages of memory cell arrays, the sense amplifier units, and the shift registers, which are arranged vertically in the drawing. Here, n units of the shift register 3a, the shift register 3b, . . . , and the shift register 3n in the semiconductor memory device 51 are disposed and connected similarly to the configuration in the first embodiment.

A memory cell array 4a on the first stage includes multiple memory cells and each of the memory cells stores information. The sense amplifier unit 2a on the first stage contacts the memory cell array 4a on the first stage.

A memory cell array 4b on the second stage includes multiple memory cells and each of the memory cells stores information. The sense amplifier unit 2b on the second stage contacts the memory cell array 4b on the second stage.

A memory cell array 4n on the n-th stage includes multiple memory cells and each of the memory cells stores information. The sense amplifier unit 2n on the n-th stage contacts the memory cell array 4n on the n-th stage.

As shown in FIG. 6, each of the n memory cell arrays (4a, 4b, . . . , 4n) includes the memory cells which are formed and disposed in a matrix fashion (m×n units) on intersecting portions of bit lines BL and word lines WL.

A memory cell 5aa is connected to a bit line BLa and to a word line WLa. A memory cell 5ba is connected to the bit line BLa and to a word line WLb. A memory cell 5na is connected to the bit line BLa and to a word line WLn. A memory cell 5ab is connected to a bit line BLb and to the word line WLa. A memory cell 5bb is connected to the bit line BLb and to the word line WLb. A memory cell 5nb is connected to the bit line BLb and to the word line WLn. A memory cell 5am is connected to a bit line BLm and to the word line WLa. A memory cell 5bm is connected to the bit line BLm and to the word line WLb. A memory cell 5nm is connected to the bit line BLm and to the word line WLn.

The information stored in the memory cell, in the memory cell array, connected to a selected bit line BL and to a selected word line WL is read out serially by the shift register via the corresponding sense amplifier.

As described above, in the semiconductor memory device of the embodiment, the memory cell arrays, the sense amplifier units, and the shift registers are formed and disposed in n stages. Each of the n memory cell arrays (4a, 4b, . . . , 4n) includes the memory cells which are formed and disposed in the matrix fashion (m×n units) on the intersecting portions of the bit lines BL and the word lines WL. The n units of the shift register 3a, the shift register 3b, . . . , and the shift register 3n are connected to one another on the left end side. The serial input signal Ssi is inputted to the shift register 3a on the first stage. The shift register 3a on the first stage outputs the output signal Sout1, which is the serial output signal, from the serial input end side. The serial output signal Sout1 is inputted as the serial input signal to the shift register 3b on the second stage. The shift register 3b on the second stage outputs the output signal Sout2, which is the serial output signal, from the serial input end side. The serial output signal Sout(n−1) is inputted as the serial input signal to the shift register 3n on the n-th stage. The shift register 3n on the n-th stage outputs the output signal Soutn, which is the serial output signal, from the serial input end side. In the n units of the shift register 3a, the shift register 3b, . . . , and the shift register 3n, the signal processing units and the reversed signal processing units are disposed adjacent to one another. In the n units of the shift register 3a, the shift register 3b, . . . , and the shift register 3n, the signal processing units located on the odd-numbered positions counted from the input end side are connected to one another while the reversed signal processing units located on the even-numbered positions counted from the input end side are connected to one another. In the n units of the shift register 3a, the shift register 3b, . . . , and the shift register 3n, the signal processing units located on the end opposite to the input end side are connected to the reversed signal processing units located on the end opposite to the input end side. Each of the signal processing units includes the logic circuit unit 12a and the flip-flop 61a while each of the reversed signal processing units includes the reversed logic circuit unit 12b and the reversed flip-flop 61b.

Accordingly, it is possible to drastically suppress an influence of a wiring delay and the semiconductor memory device 51 can perform high-speed serial input/output access to large-sized data.

Figure 7:
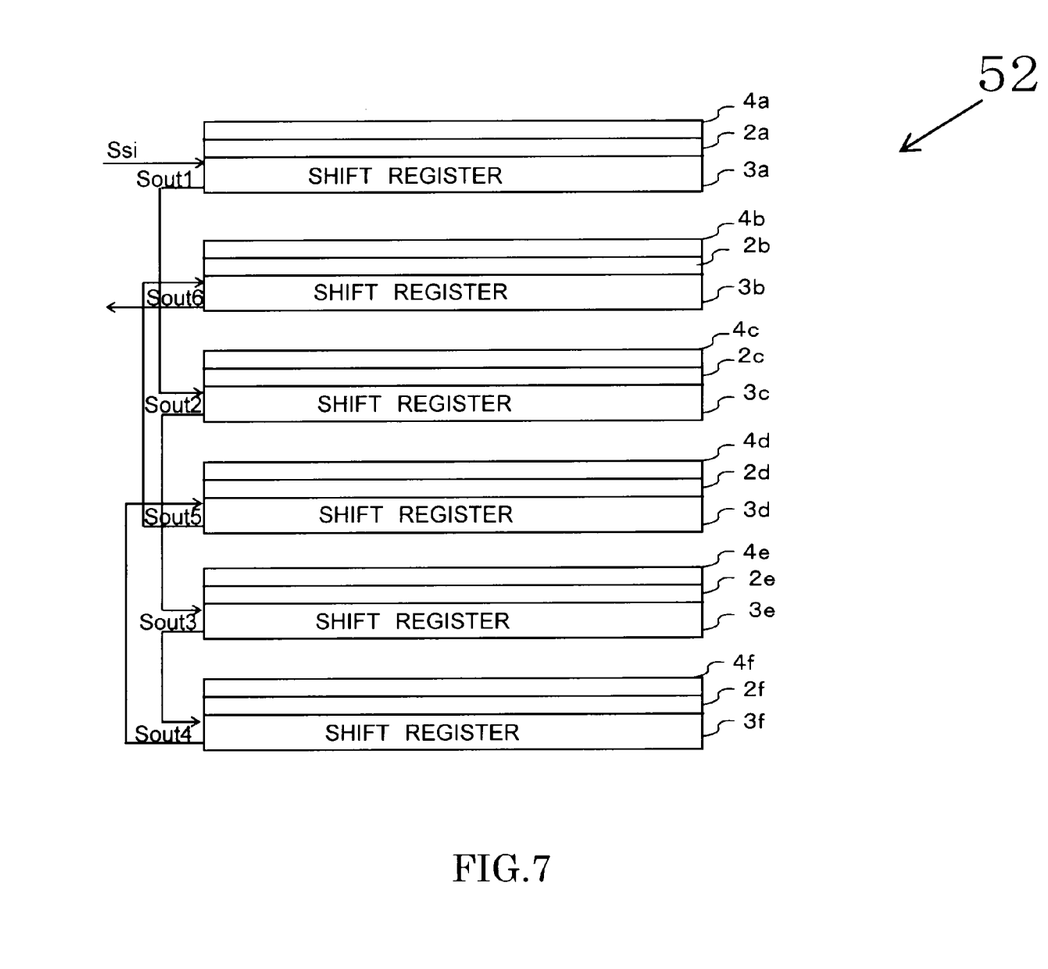
FIG. 7 is a block diagram showing a semiconductor memory device according to a third embodiment of the invention.

A semiconductor memory device according to a third embodiment of the invention will be described with reference to FIG. 7. FIG. 7 is a block diagram showing a semiconductor memory device. In the embodiment, a connecting method of the shift registers is modified.

As shown in FIG. 7, a semiconductor memory device 52 includes six stages of the memory cell arrays, the sense amplifier units, and the shift registers, which are arranged vertically in the drawing.

The memory cell array 4a on the first stage, the memory cell array 4b on the second stage, a memory cell array 4c on the third stage, a memory cell array 4d on the fourth stage, a memory cell array 4e on the fifth stage, and a memory cell array 4f on the sixth stage have the same circuit configuration and are disposed in the same direction.

The sense amplifier unit 2a on the first stage, the sense amplifier unit 2b on the second stage, a sense amplifier unit 2c on the third stage, a sense amplifier unit 2d on the fourth stage, a sense amplifier unit 2e on the fifth stage, and a sense amplifier unit 2f on the sixth stage have the same circuit configuration and are disposed in the same direction.

The shift register 3a on the first stage, the shift register 3b on the second stage, a shift register 3c on the third stage, a shift register 3d on the fourth stage, a shift register 3e on the fifth stage, and a shift register 3f on the sixth stage have the same circuit configuration and are disposed in the same direction. The clock signal Sclk and the load signal Sld are inputted from the left side in the drawing to the shift register 3a on the first stage, the shift register 3b on the second stage, the shift register 3c on the third stage, the shift register 3d on the fourth stage, the shift register 3e on the fifth stage, and the shift register 3f on the sixth stage.

The memory cell array 4a on the first stage includes multiple memory cells and each of the memory cells stores information. The sense amplifier unit 2a on the first stage contacts the memory cell array 4a on the first stage. The shift register 3a on the first stage contacts the sense amplifier unit 2a on the first stage and the serial input signal Ssi is inputted to the shift register 3a. The shift register 3a on the first stage reads the information out of the memory cells in the memory cell array 4a on the first stage serially and outputs the output signal Sout1 from the side to which the serial input signal Ssi is inputted (the left side in the drawing).

The memory cell array 4c on the third stage includes multiple memory cells and each of the memory cells stores information. The sense amplifier unit 2c on the third stage contacts the memory cell array 4c on the third stage. The shift register 3c on the third stage contacts the sense amplifier unit 2c on the third stage and the output signal Sout1 outputted from the shift register 3a on the first stage is inputted as the input signal to the shift register 3c. The shift register 3c on the third stage reads the information out of the memory cells in the memory cell array 4c on the third stage serially and outputs the output signal Sout2 from the side to which the input signal is inputted (the left side in the drawing).

The memory cell array 4e on the fifth stage includes multiple memory cells and each of the memory cells stores information. The sense amplifier unit 2e on the fifth stage contacts the memory cell array 4e on the fifth stage. The shift register 3e on the fifth stage contacts the sense amplifier unit 2e on the fifth stage and the output signal Sout2 outputted from the shift register 3c on the third stage is inputted as the input signal to the shift register 3e. The shift register 3e on the fifth stage reads the information out of the memory cells in the memory cell array 4e on the fifth stage serially and outputs an output signal Sout3 from the side to which the input signal is inputted (the left side in the drawing).

The memory cell array 4f on the sixth stage includes multiple memory cells and each of the memory cells stores information. The sense amplifier unit 2f on the sixth stage contacts the memory cell array 4f on the sixth stage. The shift register 3f on the sixth stage contacts the sense amplifier unit 2f on the sixth stage and the output signal Sout3 outputted from the shift register 3e on the fifth stage is inputted as the input signal to the shift register 3f. The shift register 3f on the sixth stage reads the information out of the memory cells in the memory cell array 4f on the sixth stage serially and outputs an output signal Sout4 from the side to which the input signal is inputted (the left side in the drawing).

The memory cell array 4d on the fourth stage includes multiple memory cells and each of the memory cells stores information. The sense amplifier unit 2d on the fourth stage contacts the memory cell array 4d on the fourth stage. The shift register 3d on the fourth stage contacts the sense amplifier unit 2d on the fourth stage and the output signal Sout4 outputted from the shift register 3f on the sixth stage is inputted as the input signal to the shift register 3d. The shift register 3d on the fourth stage reads the information out of the memory cells in the memory cell array 4d on the fourth stage serially and outputs an output signal Sout5 from the side to which the input signal is inputted (the left side in the drawing).

The memory cell array 4b on the second stage includes multiple memory cells and each of the memory cells stores information. The sense amplifier unit 2b on the second stage contacts the memory cell array 4b on the second stage. The shift register 3b on the second stage contacts the sense amplifier unit 2b on the second stage and the output signal Sout5 outputted from the shift register 3d on the fourth stage is inputted as the input signal to the shift register 3b. The shift register 3b on the second stage reads the information out of the memory cells in the memory cell array 4b on the second stage serially and outputs an output signal Sout6 from the side to which the input signal is inputted (the left side in the drawing).

As described above, in the semiconductor memory device of the embodiment, the memory cell arrays, the sense amplifier units, and the shift registers are formed and disposed in six stages. Each of the six memory cell arrays (4a, 4b, 4c, 4d, 4e, 4f) includes the memory cells which are formed and disposed in the matrix fashion (m×n units) on the intersecting portions of the bit lines BL and the word lines WL. The serial input signal Ssi is inputted to the shift register 3a on the first stage and the output signal Sout1, which is the serial output signal, is outputted from the serial input end side. The output signal Sout1 from the shift register 3a on the first stage is inputted as the serial input signal to the shift register 3c on the third stage. The output signal Sout2 from the shifter register 3c on the third stage is inputted as the serial input signal to the shift register 3e on the fifth stage. The output signal Sout3 from the shift register 3e on the fifth stage is inputted as the serial input signal to the shift register 3f on the sixth stage. The output signal Sout4 from the shifter register 3f on the sixth stage is inputted as the serial input signal to the shift register 3d on the fourth stage. The output signal Sout5 from the shifter register 3d on the fourth stage is inputted as the serial input signal to the shift register 3b on the second stage. The output signal Sout6, which is the serial output signal, is outputted from serial input end side. In the shift register 3a, the shift register 3b, the shift register 3c, the shift register 3d, the shift register 3e, and the shift register 3f, the signal processing units and the reversed signal processing units are disposed adjacent to one another. The signal processing units located on the odd-numbered positions counted from the input end side are connected to one another while the reversed signal processing units located on the even-numbered positions counted from the input end side are connected to one another. In the shift register 3a, the shift register 3b, the shift register 3c, the shift register 3d, the shift register 3e, and the shift register 3f, the signal processing units located on the end opposite to the input end side are connected to the reversed signal processing units located on the end opposite to the input end side. Each of the signal processing units includes the logic circuit unit 12a and the flip-flop 61a and while each of the reversed signal processing units includes the reversed logic circuit unit 12b and the reversed flip-flop 61b.

Accordingly, it is possible to drastically suppress an influence of a wiring delay and the semiconductor memory device 52 can perform high-speed serial input/output access to large-sized data. Moreover, the positions on the input end side and the output end side are fixed irrespective of the number of stages of the shift registers. Hence it is possible to realize the highly extensible semiconductor memory device 52 which achieves a reading operation at a high speed.

Although the embodiment is configured to form six stages of the memory cell arrays, the sense amplifier units, and the shift registers, it is also possible to implement a configuration including odd-numbered stages or a configuration including multiple stages equal to or above four stages other than six stages.

Figure 8:
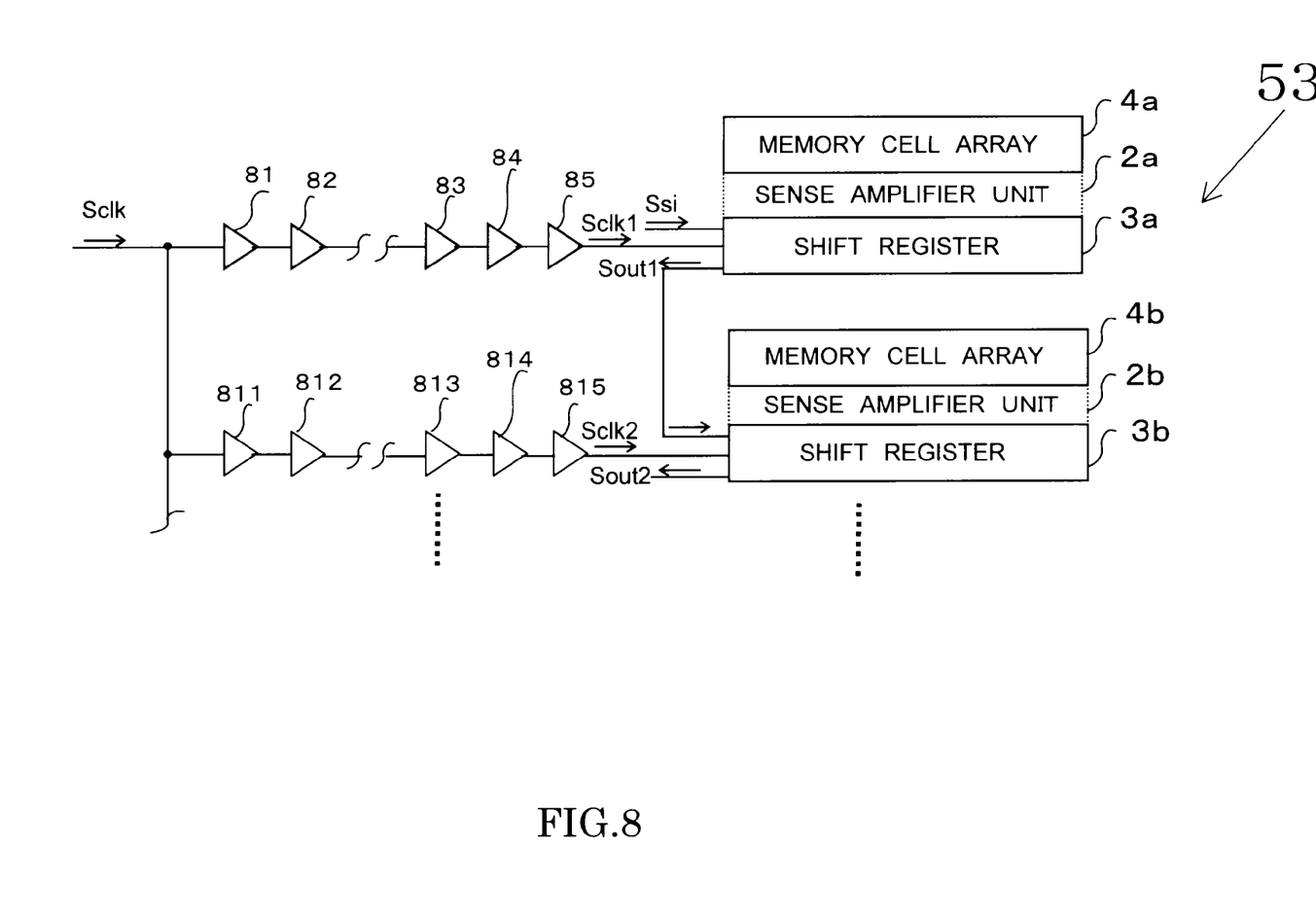
FIG. 8 is a block diagram showing a semiconductor memory device according to a fourth embodiment of the invention.

A semiconductor memory device according to a fourth embodiment of the invention will be described with reference to FIG. 8. FIG. 8 is a block diagram showing a semiconductor memory device. The embodiment employs clock signal lines at the same level in a clock tree.

In the following, identical portions to those in the second embodiment will be designated by identical reference numerals and only different portions will be described while omitting explanation on the identical portions.

As shown in FIG. 8, a semiconductor memory device 53 includes the sense amplifier unit 2a, the sense amplifier unit 2b, the shift register 3a, the shift register 3b, the memory cell array 4a, the memory cell array 4b, buffers 81 to 85, and buffers 811 to 815. The semiconductor memory device 53 includes clock signal lines at the same level in the clock tree.

Here, the sense amplifier unit 2c, the shift register 3c, the memory cell array 4c, buffers 821 to 825, and subsequent portions are formed and disposed similarly. Hence illustration and explanation of the portions will be omitted.

The clock signal Sclk is inputted to the buffer 81 and the buffer 81 drives this signal. The buffers 82 to 85 are serially connected between the buffer 81 and the shift register 3a and drive inputted signals. A clock signal Sclk1 outputted from the buffer 85 is slower than the clock signal Sclk due to an influence of a RC delay or the like.

The clock signal Sclk is inputted to the buffer 811 and the buffer 811 drives this signal. The buffers 812 to 815 are serially connected between the buffer 811 and the shift register 3b and drive inputted signals. A clock signal Sclk2 outputted from the buffer 815 is slower than the clock signal Sclk due to an influence of a RC delay or the like. Moreover, a RC delay value in the clock signal Sclk2 is set smaller than a RC delay value on the signal line to transmit the clock signal Sclk1. For this reason, the clock signal Sclk2 is transmitted to the shift register earlier than the clock signal Sclk1.

Figure 9:
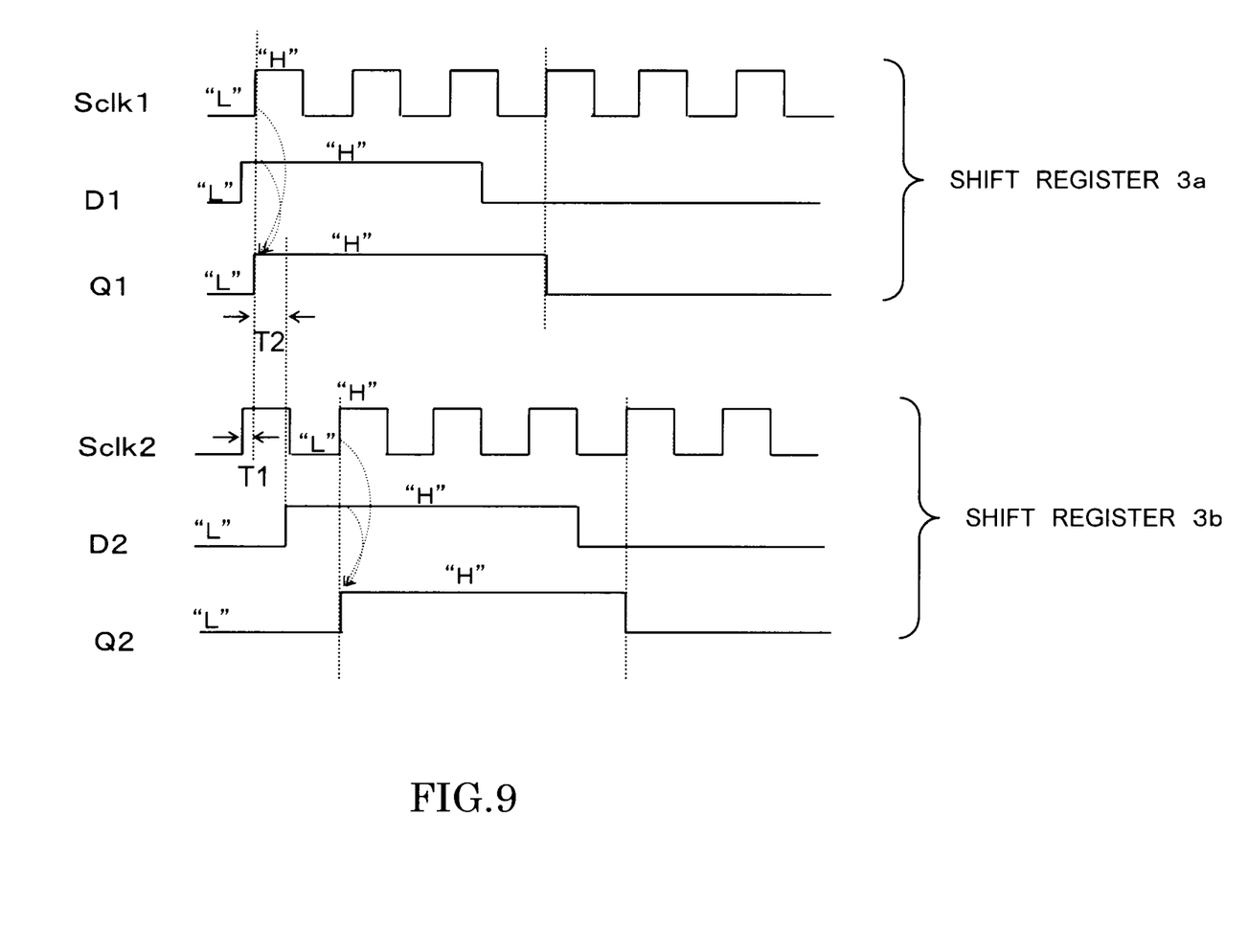
FIG. 9 is a timing chart showing a data readout operation according to the fourth embodiment of the invention.

Next, a data readout operation will be described with reference to FIG. 9. FIG. 9 is a timing chart showing a data readout operation.

As shown in FIG. 9, in the shift register 3a on the first stage, data D1 is inputted to a D port of a flip-flop and is latched at a rising edge of the clock signal Sclk1. The shift register 3a on the first stage outputs the latched data Q1 from a Q port of the flip-flop. The shift register 3a on the first stage outputs the output signal Sout1 which is the serial output signal.

The output signal Sout1 outputted from the shift register 3a on the first stage is inputted as the input signal to the shift register 3b on the second stage. In the shift register 3b on the second stage, data D2 which is delayed just for a period T2 relative to the data D1 due to a RC delay is inputted and is latched at a rising edge of the clock signal Sclk2 which is earlier just by a period T1 than the clock signal Sclk1. The shift register 3b on the second stage outputs the latched data Q2 from a Q port of a flip-flop.

As described above, according to the semiconductor memory device of the embodiment includes the sense amplifier unit 2a, the sense amplifier unit 2b, the shift register 3a, the shift register 3b, the memory cell array 4a, the memory cell array 4b, the buffers 81 to 85, the buffers 811 to 815, and the clock signal lines provided at the same level in the clock tree. In the shift register 3a and the shift register 3b, the signal processing units and the reversed signal processing units are disposed adjacent to one another. The signal processing units located on the odd-numbered positions counted from the input end side are connected to one another while the reversed signal processing units located on the even-numbered positions counted from the input end side are connected to one another. In the shift register 3a and the shift register 3b, the signal processing units located on the end opposite to the input end side are connected to the reversed signal processing units located on the end opposite to the input end side. Each of the signal processing units includes the logic circuit unit 12a and the flip-flop 61a while each of the reversed signal processing units includes the reversed logic circuit unit 12b and the reversed flip-flop 61b. The serial input signal Ssi is inputted to the shift register 3a on the first stage, and the output signal Sout1 which is the serial output signal is outputted from the side to which the serial input signal Ssi is inputted via the clock signal line at the same level in the clock tree, based on the clock signal Sclk1. The output signal Sout1 subjected to the RC delay is inputted as the serial input signal to the shift register 3b on the second stage. The shift register 3b on the second stage outputs the output signal Sout2 which is the serial output signal from the side to which the serial input signal is inputted via the clock signal line on the same tier of the clock tree, based on the clock signal Sclk2 earlier just by the period T1 than the clock signal Sclk1.

Accordingly, it is possible to drastically reduce the period T2 which is the RC delay period of the data in the shift register 3b on the second stage relative to the data in the shift register 3a on the first stage. Therefore, the semiconductor memory device 53 is producible to be capable of a high speed data readout operation in which a data latch failure is highly unlikely to occur.

The invention is not limited only to the above-described embodiments and various modifications are possible without departing from the scope of the invention.

In the embodiments, the reversed flip-flops and the reversed logic circuit units provided in the reversed signal processing units are laterally reversed relative to the flip-flops and the logic circuit units provided in the signal processing units. However, the invention is not limited only to this configuration. For example, it is preferable to invert vertically when the shift registers are arranged vertically. Alternatively, it is also possible to displace layout positions of the flip-flops and the logic circuit units of the signal processing units in the vertical direction, for example, relative to layout positions of the reversed flip-flops and the reversed logic circuit units of the reversed signal processing units.

What is claimed is:

1. A semiconductor memory device comprising:
a shift register including first latch circuits and second latch circuits being disposed alternately, repeatedly and adjacently to one another, the shift register receiving an input signal and outputting an output signal, wherein each of the second latch circuits is disposed to have a configuration reversed from configurations of the first latch circuits, the input signal is inputted to one of the first latch circuits arranged on an input end side, an output side of the one of the first latch circuits provided on the input end side is electrically connected to an input side of one of the first latch circuits which is disposed through one of the second latch circuits and which is provided on an end side opposite to the input end side, an output side of the one of the first latch circuits provided on the end side is electrically connected to an input side of one of the second latch circuits provided on the end side, an output side of the one of the second latch circuits provided on the end side is electrically connected to an input side of one of the second latch circuits which is disposed through one of the first latch circuits provided on the input end side, and the output signal is serially accessed and is outputted to the input end side from the one of the second latch circuits provided on the input end side.

2. The semiconductor memory device according to claim 1, wherein
a clock signal is inputted to the first and second latch circuits from the same direction as the input signal.

3. The semiconductor memory device according to claim 1, wherein
each of the first and second latch circuits is a D type flip-flop or a JK type flip-flop.

4. A semiconductor memory device comprising:
a shift register including a plurality of first signal processing units and a plurality of second signal processing units, the first signal processing units each having a first latch circuit and a first logic circuit unit, the second signal processing units each having a second latch circuit disposed to have a configuration reversed from a configuration of the first latch circuit and a second logic circuit unit disposed to have a configuration reversed from a configuration of the first logic circuit unit, the first signal processing units and the second signal processing units being alternately, repeatedly and adjacently to one another, the shift register receiving an input signal and outputting an output signal, wherein
memory information read out is inputted to each of the first and second logic circuit units,
a signal outputted from the first logic circuit unit is inputted to the first latch circuit,
a signal outputted from the second logic circuit unit is inputted to the second latch circuit,
the input signal is inputted to the first latch circuit arranged on an input end side via the first logic circuit unit arranged on the input end side,
an output side of the one of the first signal processing units provided on the input end side is electrically connected to an input side of one of the first signal processing units which is disposed through one of the second signal processing units and which is provided on an end side opposite to the input end side,
an output side of the one of the first signal processing units provided on the end side is electrically connected to an input side of one of the second signal processing units provided on the end side,
an output side of the one of the second signal processing units provided on the end side is electrically connected to an input side of one of the second signal processing units which is disposed through one of the first signal processing units and which is provided on the input end side, and the output signal is serially accessed and is outputted to the input end side from the one of the second latch circuits provided on the input end side.

5. The semiconductor memory device according to claim 4, wherein
a clock signal is inputted to the first and second latch circuits from the same direction as the input signal.

6. The semiconductor memory device according to claim 4, wherein
a load signal is inputted to the first and second logic circuit units from the same direction as the input signal.

7. The semiconductor memory device according to claim 6, wherein
each of the first and second logic circuit units comprising:
a first two-input AND circuit receiving the read-out memory information and the load signal;
a second two-input AND circuit receiving a serial input signal or a signal outputted from a Q port of the corresponding latch circuit and input of an reversed signal of the load signal; and
a third two-input AND circuit receiving an output signal from the first two-input AND circuit and an output signal from the second two-input AND circuit and outputting an output signal to a D port of the corresponding latch circuit.

8. The semiconductor memory device according to claim 4, wherein
each of the first and second latch circuits is a D type flip-flop or a JK type flip-flop.

9. A semiconductor memory device comprising;
a first shift register including a plurality of first signal processing units and a plurality of second signal processing units, the first signal processing units each having a first latch circuit and a first logic circuit unit, the second signal processing units each having a second latch circuit disposed to have a configuration reversed from a configuration of the first latch circuit and a second logic circuit unit disposed to have a configuration reversed from a configuration of the first logic circuit unit, the first signal processing units and the second signal processing units being alternately, repeatedly and adjacently to one another, the first shift register receiving a first input signal and outputting a first output signal; and
a second shift register having the same circuit configuration as the circuit configuration of the first shift register, being disposed in parallel to and in the same direction as the first shift register, and receiving a second input signal and outputting a second output signal, wherein
memory information read out is inputted to each of the first and second logic circuit units,
a signal outputted from the first logic circuit unit is inputted to the first latch circuit,
a signal outputted from the second logic circuit unit is inputted to the second latch circuit,
the first and second input signals are inputted from the same direction,
the first input signal is inputted to the first latch circuit provided on an input end side in the first shift register via the first logic circuit unit provided on the input end side in the first shift register,
the second input signal is inputted to the first latch circuit provided on an input end side in the second shift register via the first logic circuit unit provided on the input end side in the second shift register, an output side of the one of the first signal processing units provided on the input end side in the first shift register is electrically connected to an input side of one of the first signal processing units in the first shift register which is disposed through one of the second signal processing units and which is provided on an end side opposite to the input end side, an output side of the one of the first signal processing units provided on the input end side in the second shift register is electrically connected to an input side of one of the first signal processing units of the second shift register which is disposed through one of the second signal processing units and which is provided on the end side, an output side of the one of the first signal processing units provided on the end side in the first shift register is electrically connected to an input side of one of the second signal processing units provided on the end side in the first shift register, an output side of the one of the first signal processing units provided on the end side in the second shift register is electrically connected to an input side of one of the second signal processing units of the second shift register provided on the end side in the second shift register, an output side of the one of the second signal processing units provided on the end side in the first shift register is electrically connected to an input side of one of the second signal processing units in the first shift register which is disposed through one of the first signal processing units which is provided on the input end side, an output side of the one of the second signal processing units provided on the end side in the second shift register is electrically connected to an input side of one of the second signal processing units in the second shift register which is disposed through one of the first signal processing units which is provided on the input end side, the first output signal is serially accessed and is outputted to the input end side from the one of the second latch circuits provided on the input end side of the first shift register, the second shift register receives the first output signal as the second input signal, and the second output signal is serially accessed and is outputted to the input end side from the one of the second latch circuits provided on the input end side in the second shift register.

10. The semiconductor memory device according to claim 9, wherein a first clock signal is inputted to the first and second latch circuits provided on the first shift register, a second clock signal is inputted to the first and second latch circuits provided on the second shift register, and the first and second clock signals are the clock signals transmitted from clock signal lines at the same level in a clock tree.

11. The semiconductor memory device according to claim 9, further comprising:

third to n-th (n being an even number equal to or above 4) shift registers each having the same circuit configuration as the circuit configuration of the first shift register and being disposed in parallel to and in the same direction as the second shift register.

12. The semiconductor memory device according to claim 11, wherein a clock signal is inputted to each of the first to n-th shift registers from the same direction as the first input signal.

13. The semiconductor memory device according to claim 11, wherein a load signal is inputted to each of the first to n-th shift registers from the same direction as the first input signal.

14. The semiconductor memory device according to claim 11, wherein an output signal outputted from each of the odd-numbered shift registers is inputted as an input signal to the even-numbered shift register subsequent to the odd-numbered shift register.

15. The semiconductor memory device according to claim 11, wherein an output signal outputted from an odd-numbered one of the shift registers is inputted as an input signal to the subsequent odd-numbered shift register, an output signal outputted from the (n−1)-th shift register is inputted as an input signal to the n-th shift register, an output signal outputted from an even-numbered one of the shift registers is inputted as an input signal to the preceding even-numbered shift register, and n is a positive integer, and a value of n is more than two.

* * * * *